United States Patent
Chen et al.

(10) Patent No.: US 9,526,338 B2
(45) Date of Patent: Dec. 27, 2016

(54) MOUNTING BRACKET FOR SLIDE ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); I-Ming Tseng, Kaohsiung (TW); Chun-Yi Ho, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 191 days.

(21) Appl. No.: 14/023,748

(22) Filed: Sep. 11, 2013

(65) Prior Publication Data

US 2015/0069196 A1 Mar. 12, 2015

(51) Int. Cl.

| A47B 96/06 | (2006.01) |
|---|---|
| A47B 46/00 | (2006.01) |
| A47B 96/14 | (2006.01) |
| A47B 47/00 | (2006.01) |
| A47B 96/07 | (2006.01) |
| H05K 7/14 | (2006.01) |
| A47B 88/04 | (2006.01) |

(52) U.S. Cl.
CPC ............... *A47B 96/06* (2013.01); *A47B 46/00* (2013.01); *A47B 47/0058* (2013.01); *A47B 88/044* (2013.01); *A47B 96/067* (2013.01); *A47B 96/068* (2013.01); *A47B 96/07* (2013.01); *A47B 96/145* (2013.01); *A47B 96/1441* (2013.01); *H05K 7/1489* (2013.01); *H05K 7/1498* (2013.01); *A47B 96/1408* (2013.01); *A47B 96/1458* (2013.01); *A47B 2088/0444* (2013.01)

(58) Field of Classification Search
CPC ............................. A47B 88/044; A47B 96/06
See application file for complete search history.

(56) References Cited

U.S. PATENT DOCUMENTS

| 7,281,694 | B2 | 10/2007 | Allen et al. |
|---|---|---|---|
| 7,552,899 | B2 | 6/2009 | Chen et al. |
| 7,694,926 | B2 | 4/2010 | Allen et al. |
| 7,699,279 | B2 * | 4/2010 | Chen et al. ............... 248/220.41 |

(Continued)

FOREIGN PATENT DOCUMENTS

| EP | 2425744 A1 * | 3/2012 | |
|---|---|---|---|
| GB | 2442005 A * | 3/2008 | ............. A47B 88/04 |

(Continued)

*Primary Examiner* — Joshua J Michener
*Assistant Examiner* — Chiedu Chibogu
(74) *Attorney, Agent, or Firm* — Rosenberg, Klein & Lee

(57) ABSTRACT

A mounting bracket for a slide assembly includes a side wall, an end wall, at least one installation member, a stop, and a resilient member. The end wall is substantially perpendicular to the side wall. The at least one installation member is connected to the end wall. The stop is pivotably connected to the side wall and includes a first portion and a middle portion which is connected to the first portion. The middle portion has a first end portion. The resilient member provides a force to the stop to position the first end portion of the stop to be located corresponding to the end wall.

11 Claims, 6 Drawing Sheets

(56) References Cited

U.S. PATENT DOCUMENTS

| | | | |
|---|---|---|---|
| 7,744,177 B2 * | 6/2010 | Peng et al. | 312/334.4 |
| 7,798,581 B2 * | 9/2010 | Chen et al. | 312/265.1 |
| 7,878,468 B2 * | 2/2011 | Chen et al. | 248/220.41 |
| 8,028,965 B2 * | 10/2011 | Chen et al. | 248/298.1 |
| 8,231,188 B1 * | 7/2012 | Chen et al. | 312/333 |
| 8,240,789 B2 * | 8/2012 | Chen et al. | 312/334.7 |
| 8,297,723 B2 * | 10/2012 | Chen et al. | 312/333 |
| 8,371,454 B2 * | 2/2013 | Chen et al. | 211/26 |
| 8,403,434 B2 * | 3/2013 | Yu et al. | 312/334.1 |
| 8,596,471 B2 * | 12/2013 | Chen et al. | 211/26 |
| 8,770,528 B2 * | 7/2014 | Chen et al. | 248/220.21 |
| 2005/0274680 A1 * | 12/2005 | Allen et al. | 211/26 |
| 2008/0067907 A1 * | 3/2008 | Chen et al. | 312/312 |
| 2008/0078899 A1 * | 4/2008 | Chen et al. | 248/220.21 |
| 2008/0087781 A1 * | 4/2008 | Chen et al. | 248/224.8 |
| 2009/0160300 A1 * | 6/2009 | Peng et al. | 312/348.2 |
| 2009/0283652 A1 * | 11/2009 | Chen et al. | 248/298.1 |
| 2009/0294393 A1 * | 12/2009 | Chen et al. | 211/175 |
| 2010/0072153 A1 * | 3/2010 | Chen et al. | 211/183 |
| 2010/0171015 A1 * | 7/2010 | Chen et al. | 248/224.8 |
| 2011/0290746 A1 * | 12/2011 | Lu | 211/26 |
| 2013/0119215 A1 * | 5/2013 | Chen et al. | 248/220.21 |
| 2014/0217049 A1 * | 8/2014 | Chen et al. | 211/195 |

FOREIGN PATENT DOCUMENTS

| | | | | |
|---|---|---|---|---|
| GB | 2442701 A | * | 4/2008 | A47B 88/04 |
| GB | 2442701 B | * | 8/2008 | |
| GB | 2459982 A | * | 11/2009 | |
| GB | 2463775 A | * | 3/2010 | |
| GB | 2442005 B | * | 10/2010 | |
| GB | 2463775 B | * | 3/2011 | |

\* cited by examiner

MOUNTING BRACKET FOR SLIDE ASSEMBLY

FIELD OF THE INVENTION

The present invention relates to a mounting bracket, and more particularly, to a mounting bracket for a slide assembly.

BACKGROUND OF THE INVENTION

U.S. Pat. No. 7,281,694 B2 to Allen et al. discloses a mounting bracket having a side plate, an end plate, a base member, a pair of pins, an abutment member and an action mechanism, wherein the abutment member has a free end. The pins are installed to the end plate of the mounting bracket, and the base member is connected to the side plate. The abutment member is fixed to the base member, and the action mechanism extends through the base member and contacts the abutment member. When the pins are installed to the holes of a post of a rack, the abutment member is deformed to allow the post of the rack to pass therethrough and abuts against the post of the rack, so as to form an enclosed room with the pins.

However, the abutment member utilized to abut against the rack and disclosed by Allen et al. is a metal resilient plate which lacks sufficient strength and may affect the stability of installation of the mounting bracket to the rack.

The present invention intends to provide a mounting bracket for a slide assembly such that the slide assembly is easily installed to a rack or removed from a rack by the mounting bracket. The mounting bracket is firmly connected to the rack.

SUMMARY OF THE INVENTION

The present invention relates to a mounting bracket for a slide assembly and comprises a side wall, an end wall substantially perpendicular to the side wall, at least one installation member connected to the end wall, a stop pivotably connected to the side wall and having a first portion and a middle portion which is connected to the first portion, the middle portion having a first end portion, and a resilient member providing a force to the stop to position the first end portion of the stop to be located corresponding to the end wall.

Preferably, the side wall has a face. The stop has a second portion connected to the middle portion. At least one of the first portion and the second portion has an extension section located corresponding to the face of the side wall. The extension section responds to the force of the resilient member and abuts against the face of the side wall.

Preferably, the face of the side wall has a contact member. A room is defined by the contact member and the face so that the resilient member is partially inserted into the room.

Preferably, the contact member has a contact portion. The resilient member has a bent portion which contacts the contact portion of the contact member.

Preferably, the contact member has a contact portion. The resilient member has two bent portions respectively located on two ends thereof. One of the two bent portions contacts the contact portion of the contact member.

Preferably, the middle portion of the stop has a side plate which is substantially perpendicular to the middle portion.

Preferably, the side wall has a first window which is located adjacent to the end wall. The first end portion of the stop is partially inserted into the first window by an external force.

Alternatively, the present invention provides a slide assembly which comprises a first rail having a first end and a second end which is located corresponding to the first end. A second rail is slidably connected to the first rail. A third rail is slidably connected to the second rail. A first mounting bracket is connected adjacent to the first end of the first rail. A second mounting bracket is connected adjacent to the second end of the first rail. At least one of the first mounting bracket and the second mounting bracket has a side wall, an end wall substantially perpendicular to the side wall, at least one installation member connected to the end wall, and a stop which is pivotably connected to the side wall. The stop has a first portion, a second portion and a middle portion which is connected to the first and second portions. The middle portion has a first end portion. A resilient member provides a force to the stop to position the first end portion of the stop to be located corresponding to the end wall.

Preferably, the side wall has a face. At least one of the first portion and the second portion of the stop has an extension portion located corresponding to the face of the side wall. The extension section responds to the force of the resilient member and abuts against the face of the side wall.

Preferably, the face of the side wall has a contact member. A room is defined by the contact member and the face so that the resilient member is partially inserted into the room. The contact member has a contact portion. The resilient member has a bent portion which contacts the contact portion of the contact member.

Preferably, the resilient member has a bent portion and a fork portion. The middle portion of the stop has a second end portion. The bent portion contacts the side wall. The fork portion contacts the second end portion of the stop.

In addition, the present invention also provides a slide assembly for being installed to a rack which has at least two posts. Each post has a plurality of holes. The slide assembly comprises a first rail having a first end and a second end which is located corresponding to the first end. A second rail is slidably connected to the first rail. A third rail is slidably connected to the second rail. A first mounting bracket is connected adjacent to the first end of the first rail. The first mounting bracket is installed to one of the posts of the rack. A second mounting bracket is connected adjacent to the second end of the first rail. The second mounting bracket is installed to the other one of the posts of the rack. At least one of the first mounting bracket and the second mounting bracket has a side wall. An end wall is substantially perpendicular to the side wall. At least one installation member is connected to the end wall. A stop has a first portion, a second portion and a middle portion which is connected to the first and second portions. The middle portion has a first end portion. A resilient member provides a force to the stop to position the first end portion of the stop to be located corresponding to the end wall. The at least one installation member is installed to one of the holes of the at least two posts of the rack. The at least two posts are located between the at least one installation member and the stop.

The primary object of the present invention is to provide a mounting bracket for a slide assembly. The slide assembly is easily installed to or removed from a rack by the mounting bracket. The installation member is securely connected to the rack.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
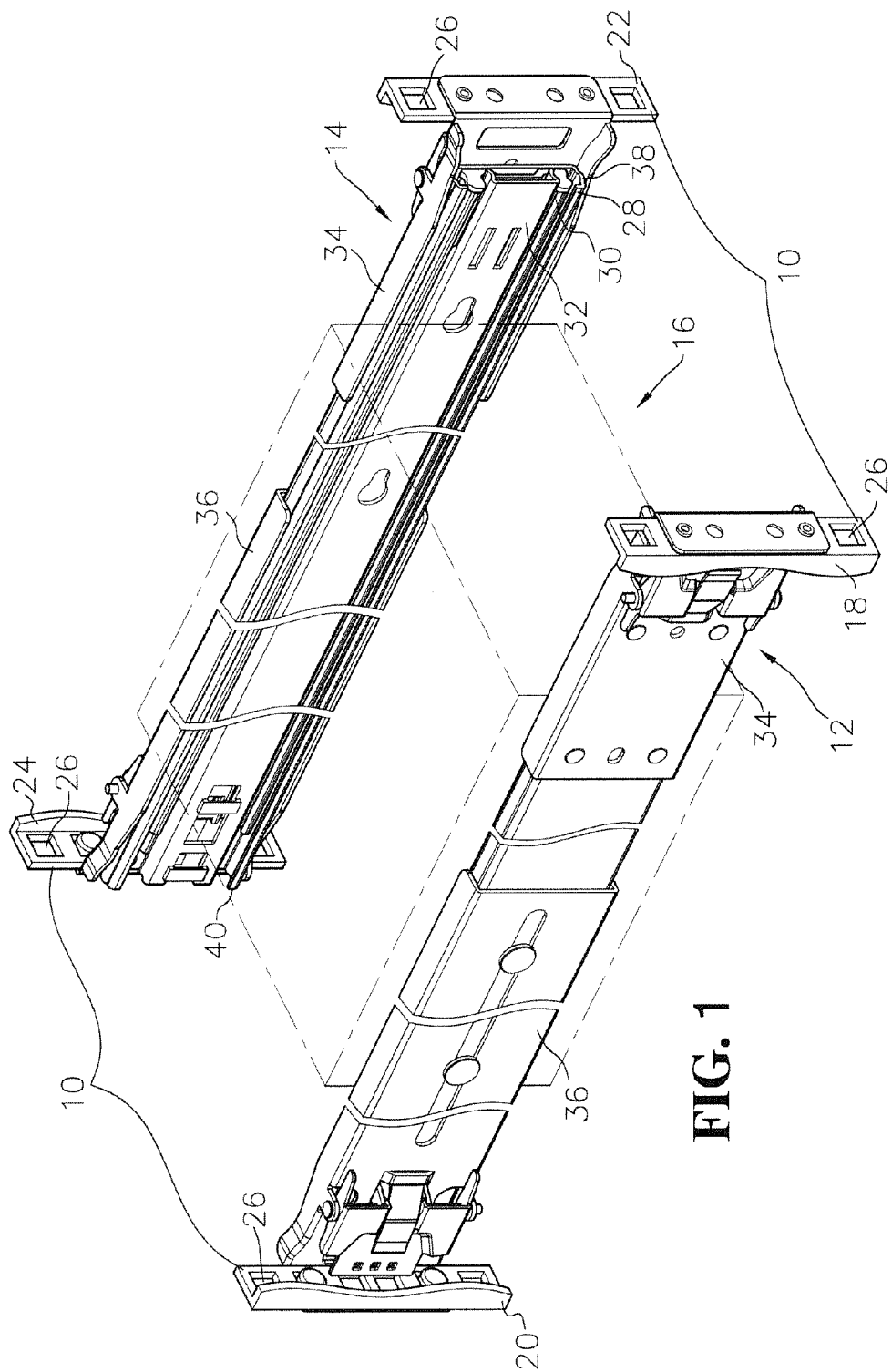
FIG. 1 is a schematic view to show that the mounting bracket of the present invention is installed to a rack.

Referring to FIG. 1, the present invention comprises a rack 10, a first slide assembly 12, a second slide assembly 14 and a chassis 16. The rack 10 comprises a first post 18, a second post 20, a third post 22 and a fourth post 24. Each of the first post 18, the second post 20, the third post 22, and the fourth post 24 has a plurality of holes 26. The first slide assembly 12 is connected between the first and second posts 18, 20 of the rack 10. The second slide assembly 14 is connected between the third and fourth posts 22, 24 of the rack 10. The first and second slide assemblies 12, 14 are parallel to each other. The chassis 16 is installed between the first and second slide assemblies 12, 14.

The first and second slide assemblies 12, 14 have the same structure and are located symmetrically with each other. Each of the first and second slide assemblies 12, 14 comprises a first rail 28, a second rail 30, a third rail 32, a first mounting bracket 34, and a second mounting bracket 36. In the following, the second slide assembly 14 is used as an illustration; wherein, the first rail 28 has a first end 38 and a second end 40 which is located corresponding to the first end 38. The second rail 30 is slidably connected to the first rail 28. The third rail 32 is slidably connected to the second rail 30. The first mounting bracket 34 is connected adjacent to the first end 38 of the first rail 28 and is installed to the third post 22 of the rack 10. The second mounting bracket 36 is connected adjacent to the second end 40 of the first rail 28 and is installed to the fourth post 24 of the rack 10.

Figure 2:
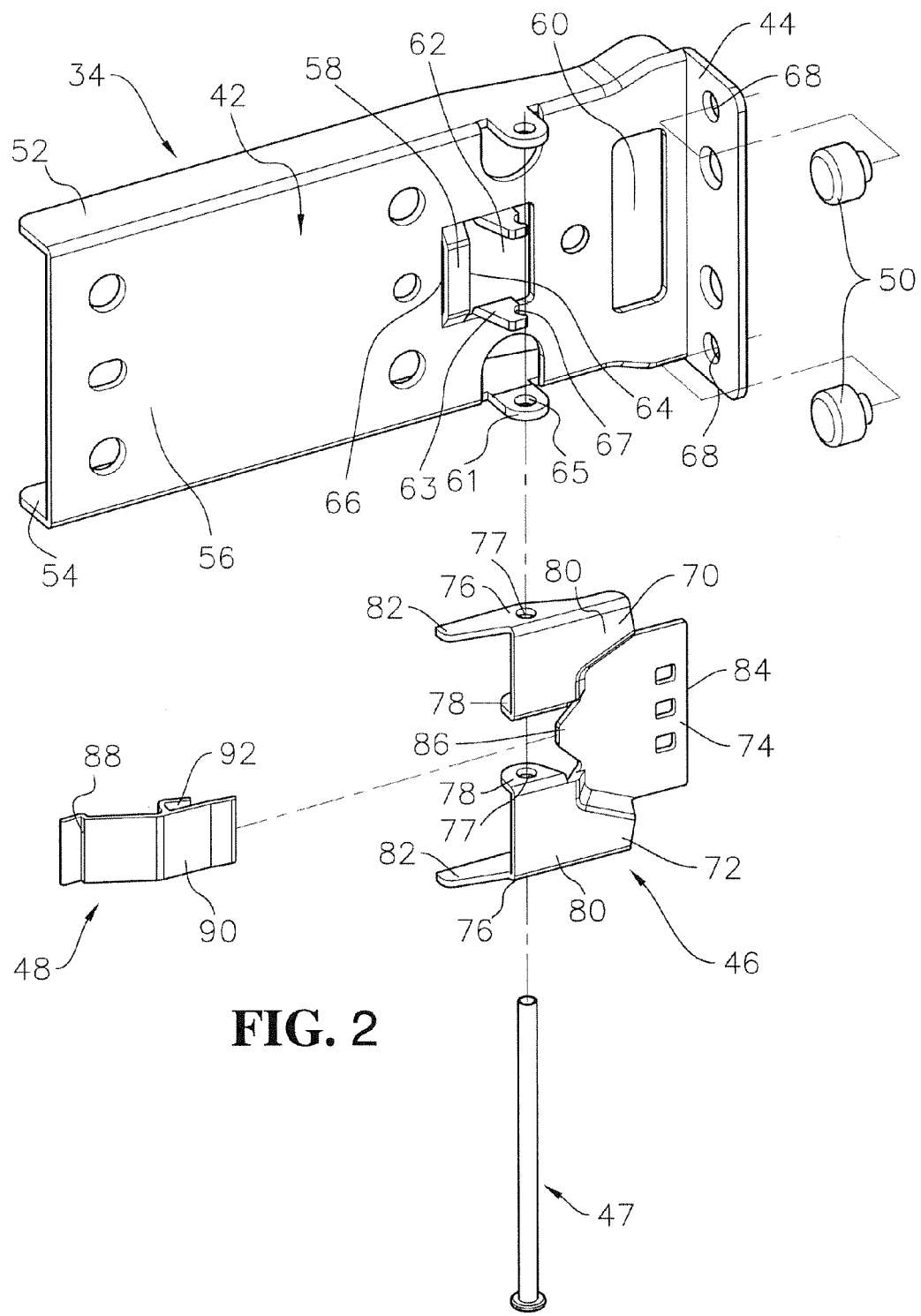
FIG. 2 is an exploded view to show the mounting bracket of the present invention.

FIG. 2 shows that the first mounting bracket 34 has a side wall 42, an end wall 44, a stop 46, a resilient member 48 and at least one installation member 50. The side wall 42 has a top wall 52, a bottom wall 54 and a face 56 which is substantially connected between the top wall 52 and the bottom wall 54 perpendicularly. The face 56 has a first window 60 and a second window 62, wherein a contact member 58 protrudes from the face 56 and toward a direction opposite to the top and bottom walls 52, 54. A difference of height is formed between the contact member 58 and the face 56, so that a room 66 is defined between the contact member 58 and the face 56. The contact member 58 has a contact portion 64 which is located adjacent to the second window 62. The first window 60 is located close to the end of the side wall 42 from which the end wall 44 extends. The end wall 44 is located close to the first window 60 and substantially perpendicularly to the face 56 of the side wall 42. The end wall 44 has at least one positioning hole 68. In one embodiment of the present invention, the side wall 42 has two lugs 61 and two supports 63, wherein the lugs 61 protrude from the top wall 52 and the bottom wall 54 respectively and extend toward the protruding direction of the contact member 58. The two lugs 61 are located close to two sides of the second window 62. Each of the two lugs 61 has a hole 65, and the holes 65 of the two lugs 61 are located corresponding to each other. The two supports 63 are located between the two lugs 61. Each of the two supports 63 has an arc concave 67 located corresponding to the holes 65 of the two lugs 61. The two supports 63 extend and protrude from the edge of the second window 62. The stop 46 has a first portion 70, a second portion 72 and a middle portion 74 which is connected to the first and second portions 70, 72. The first and second portions 70, 72 are located symmetrically with each other. Each of the first and second portions 70, 72 has a first side 76, a second side 78 and a connection wall 80 which is connected between the first and second sides 76, 78. Each of the first and second sides 76, 78 has a hole 77. The two respective holes 77 of the first and second sides 76, 78 are located symmetrically with each other. The first side 76 has an extension section 82. The middle portion 74 has a first end portion 84 and a second end portion 86 which is located corresponding to the first end portion 84. The resilient member 48 has a bent portion 88 and a fork portion 90. The bent portion 88 is located corresponding to the contact portion 64 of the contact member 58. The fork portion 90 has a recessed area 92 located corresponding to the second end portion 86 of the middle portion 74 of the stop 46. The at least one installation member 50 is located corresponding to the positioning hole 68 of the end wall 44. A pivotal member 47 is configured to the holes 77 on the first and second sides 76, 78 of the first and second portions 70, 72 of the stop 46, the holes 65 of the lugs 61 of the side wall 42, the arc concaves 67 of the supports 63 of the side wall 42. It is noted that the first and second mounting brackets 34, 36 have the same structure, the second mounting bracket 36 needs not to be described in detail.

Figure 3:
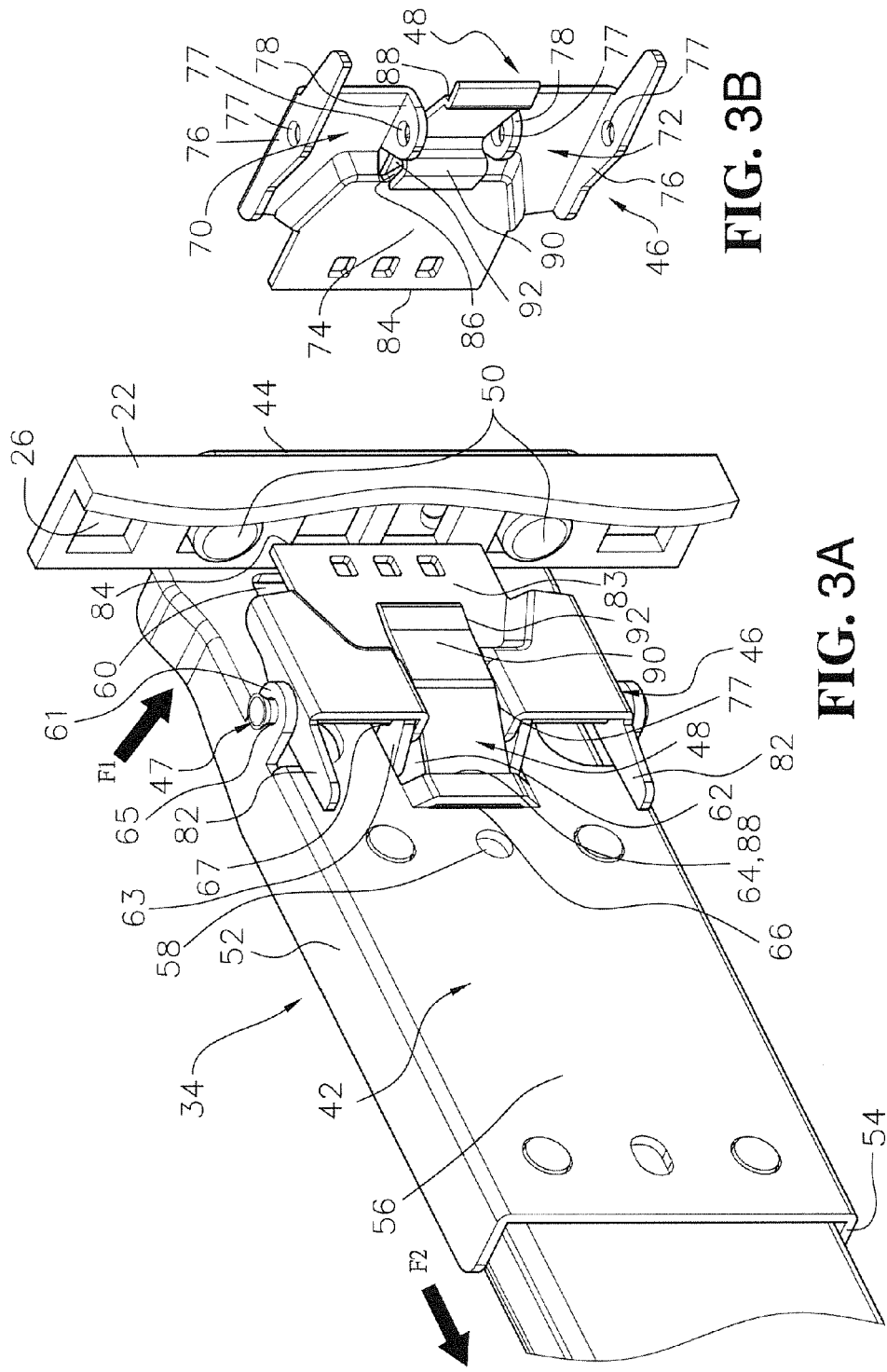
FIG. 3A is a schematic view to show the mounting bracket of the present invention.
FIG. 3B is a schematic view to show the stop of the mounting bracket and the resilient member of the present invention.

FIGS. 3A and 3B show that the stop 46 is pivotably connected to the side wall 42 by extending the pivotal member 47 through the holes 77 on the first and second sides 76, 78 of the first and second portions 70, 72 of the stop 46, the holes 65 of the lugs 61 of the side wall 42, the arc concaves 67 of the supports 63 of the side wall 42. The resilient member 48 is partially inserted into the room 66 between the face 56 of the side wall 42 and the contact member 58. The bent portion 88 of the resilient member 48 contacts the contact portion 64 of the contact member 58, and the fork portion 90 of the resilient member 48 contacts the second end portion 86 of the middle portion 74 of the stop 46. The stop 46 is applied by the force from the resilient member 48, and the extension section 82 of the stop 46 abuts against the face 56 of the side wall 42 to maintain the stop 46 at a pre-set position. The at least one installation member 50 is fixed to the end wall 44. When in assembling, the first mounting bracket 34 partially extends through the hole 26 of the third post 22, from outside toward inside, and is positioned by the at least one installation member 50, so that the first mounting bracket 34 is installed to the third post 22, and the first end portion 84 of the middle portion 74 of the stop 46 is located corresponding to the third post 22. In detail, a surface 83 of the middle portion 74 of the stop 46 of the first mounting bracket 34 first contacts the third post 22, and a force F1 is applied to let the stop 46 overcome the force of the resilient member 48 and swing an angle. The at least one installation member 50 is aimed to the hole 26 of the third post 22, and a force F2 is applied to the installation member 50 which then partially extends through the hole 26. In the meanwhile, the stop 46 is moved away from the third post 22, and returns to its pre-set position by the force released from the resilient member 48. Therefore, the first mounting bracket 34 is installed to the third post 22.

Figure 4:
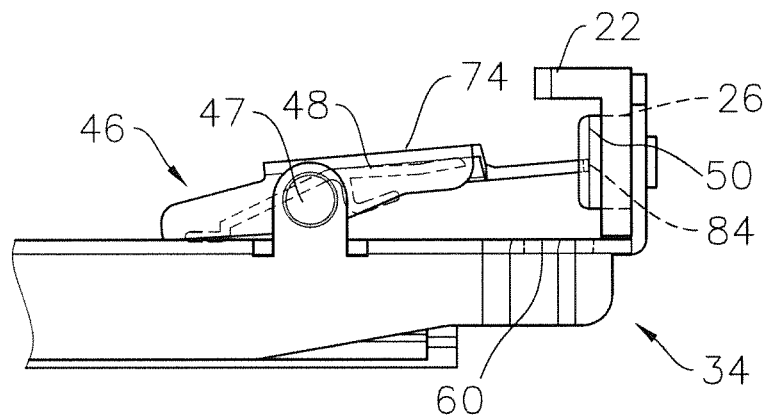
FIG. 4 is an end view to show that the mounting bracket of the present invention is installed to the rack.

FIG. 4 shows that the first mounting bracket 34 is installed to the third post 22, the installation member 50 of the first mounting bracket 34 extends through the hole 26 of the third post 22, and by being located adjacent to the third post 22, the first end portion 84 of the middle portion 74 of the stop 46 of the first mounting bracket 34 blocks the way that the installation member 50 is removed from the third post 22. Therefore, the installation member 50 is installed to the third post 22 by the stop 46 of the first mounting bracket 34. By the blocking of the stop 46, the installation member 50 does not remove from the third post 22.

Figure 5:
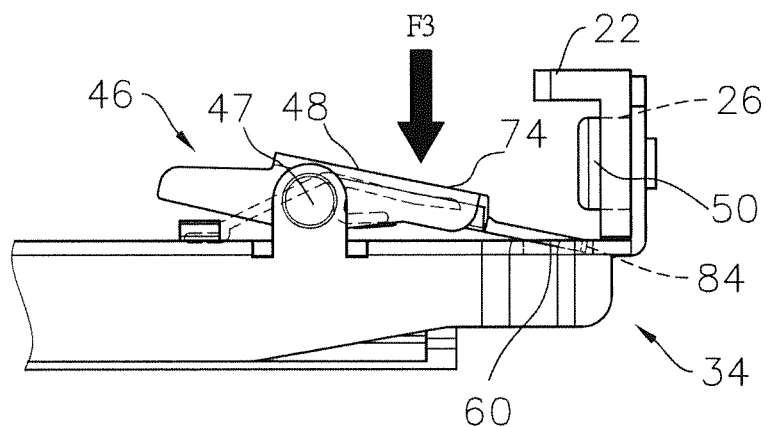
FIG. 5 is an end view to show the first action to remove the mounting bracket of the present invention from the rack.
Figure 6:
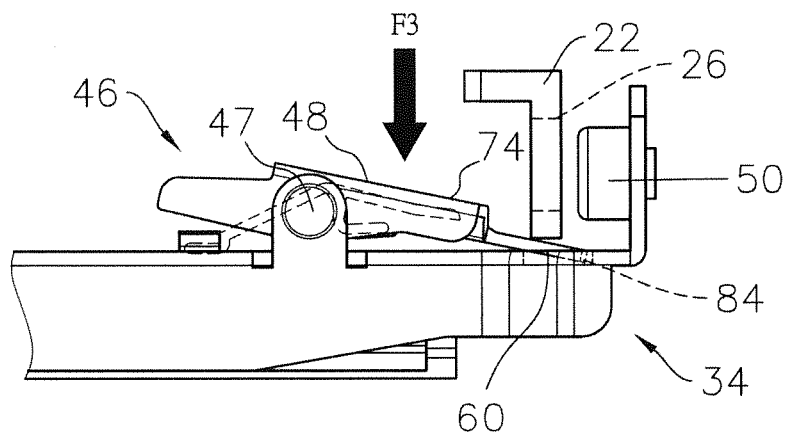
FIG. 6 is an end view to show the second action to remove the mounting bracket of the present invention from the rack.

FIGS. 5 and 6 show the operation of removing the first mounting bracket 34 from the third post 22. First, a force F3 is applied to the middle portion 74 of the stop 46 of the first mounting bracket 34, and overcomes the force from the resilient member 48, so that the stop 46 pivots an angle relative to the pivotal member 47. Preferably, the first end portion 84 of the middle portion 74 of the stop 46 is partially inserted into the first window 60 to remove the blocking of the stop 46 from the third post 22, so that the installation member 50 of the first mounting bracket 34 can be removed from the hole 26 of the third post 22, and the first mounting bracket 34 is removed from the third post 22.

Figure 7:
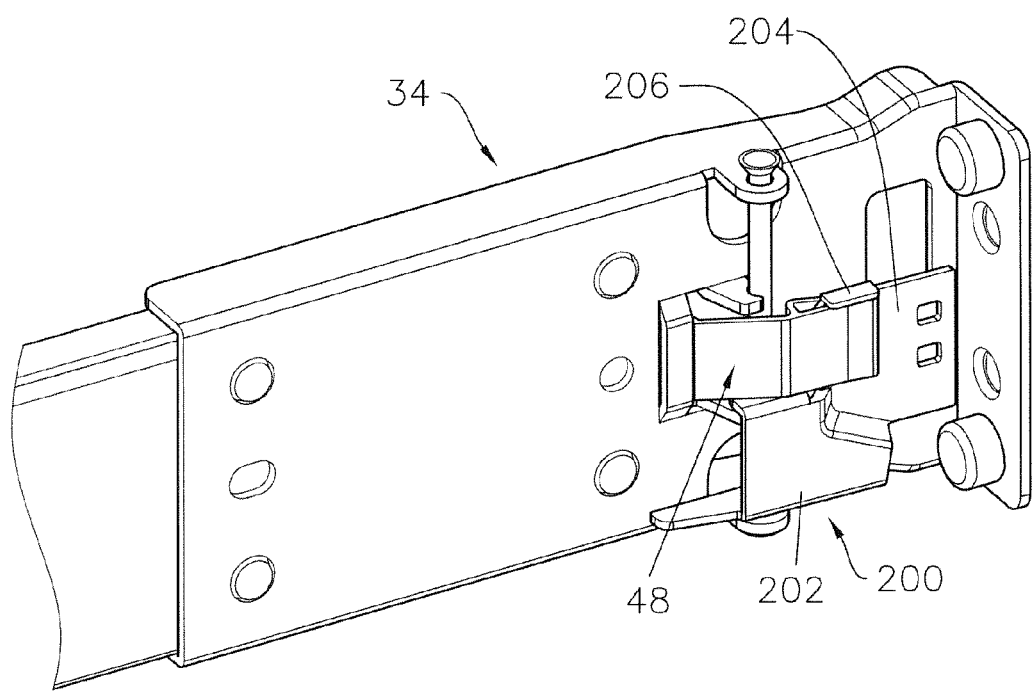
FIG. 7 is a schematic view to show the second embodiment of the mounting bracket of the present invention.

FIG. 7 shows the second embodiment of the present invention, wherein the stop 200 of the first mounting bracket 34 can only comprise the first portion 202 and the middle portion 204. The middle portion 204 has a side plate 206 to fix the resilient member 48.

Figure 8:
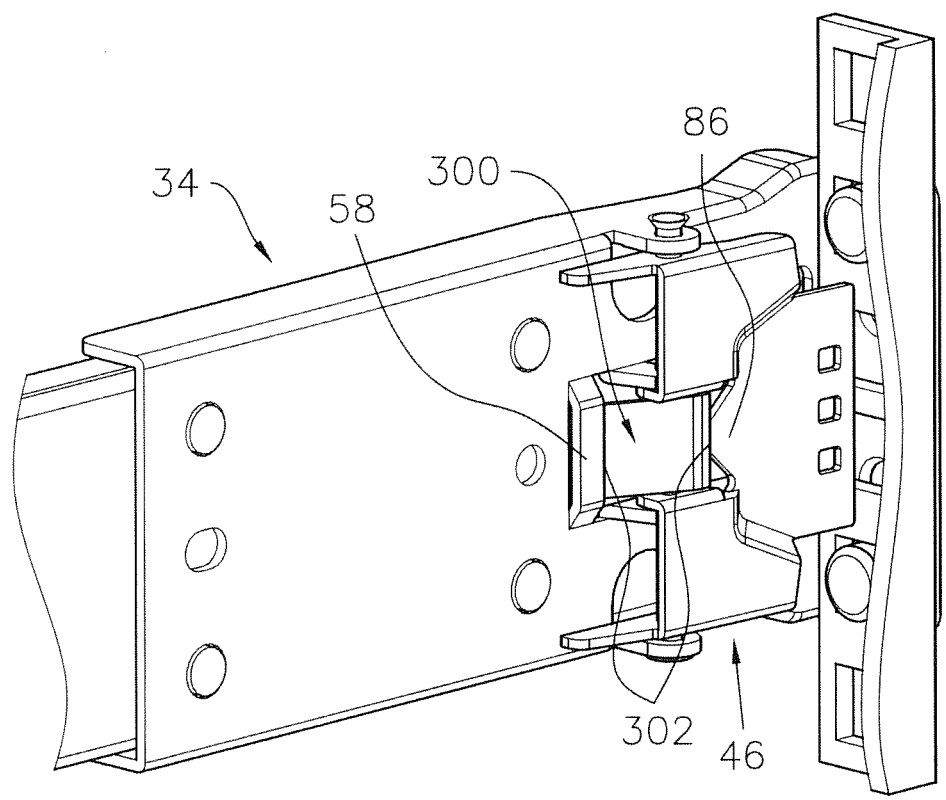
FIG. 8 is a schematic view to show the third embodiment of the mounting bracket of the present invention.

FIG. 8 shows the third embodiment of the present invention, wherein the resilient member 300 has two bent portions 302 at two ends thereof respectively. The two bent portions 302 respectively contact the contact member 58 of the first mounting bracket 34 and the second end portion 86 of the stop 46.

While we have shown and described the embodiment in accordance with the present invention, it should be clear to those skilled in the art that further embodiments may be made without departing from the scope of the present invention.

What is claimed is:

1. A mounting bracket for a slide assembly comprising:
a side wall extending in a longitudinal direction and having a face and a contact member formed thereon;
an end wall substantially perpendicular to the side wall;
at least one installation member connected to the end wall;
a stop extending in the longitudinal direction and pivotably connected to the side wall by a pivotal member and having a first portion, a second portion, and a middle portion connected to the first and second portions, the middle portion having a first free end portion and a second free end portion, the stop being pivotally displaceable between first and second positions, at least one of the first portion and the second portion having an extension section extending transversely therefrom to bear against the face of the side wall, the extension section remaining spaced from the end wall and limiting the pivotal displacement of the stop, the side wall includes two lugs and two supports, each of the two lugs has a hole, and the holes of the two lugs are located corresponding to each other, the two supports are located between the two lugs, each of the two supports has an arc concave located corresponding to the holes of the two lugs, each of the first and second portions has a first side, a second side and a connection wall which is connected between the first and second sides, each of the first and second sides has a hole, the two respective holes of the first and second sides are located symmetrically with each other, both of the second sides of the first and second portions are positioned between the two supports of the side wall, both of the first sides of the first and second portions are positioned between the two lugs of the side wall, the pivotal member pivotably connects the stop to the side wall via reception of the pivotal member in the holes of the two lugs, the arc concaves of the two supports, and the holes of the first and second sides; and
a resilient member releasably captured between the stop and contact member to extend transversely across the pivotal member, the resilient member being biased to an extended configuration to position the stop at the first position, the resilient member being deflected intermediately about the pivotal member when the stop is in the second position to capture a post against the end wall.

2. The mounting bracket as claimed in claim 1, wherein the contact member is defined at the face of the side wall, wherein a room is defined by the contact member and the face so that the resilient member is partially inserted into the room.

3. The mounting bracket as claimed in claim 2, wherein the contact member has a contact portion, the resilient member having a bent portion which contacts the contact portion of the contact member.

4. The mounting bracket as claimed in claim 2, wherein the contact member has a contact portion, the resilient member having two bent portions respectively located on two ends thereof, one of the two bent portions contacting the contact portion of the contact member.

5. The mounting bracket as claimed in claim 1, wherein the side wall has a first window which is located adjacent to the end wall, the first end portion of the stop being partially inserted into the first window by an external force.

6. A slide assembly comprising:
a first rail having a first end and a second end which is located corresponding to the first end;
a second rail slidably connected to the first rail;
a third rail slidably connected to the second rail;
a first mounting bracket connected adjacent to the first end of the first rail; and
a second mounting bracket connected adjacent to the second end of the first rail;
wherein at least one of the first mounting bracket and the second mounting bracket include:
a side wall extending in a longitudinal direction and having a face and a contact member formed thereon;
an end wall substantially perpendicular to the side wall;
at least one installation member connected to the end wall;
a stop extending in the longitudinal direction and pivotably connected to the side wall by a pivotal member and having a first portion, a second portion, and a middle portion connected to the first and second portions, the middle portion having a first free end portion and a second free end portion, the stop being pivotally displaceable between first and second positions, at least one of the first portion and the second portion having an extension section extending transversely therefrom to bear against the face of the side wall, the extension section remaining spaced from the end wall and limiting the pivotal displacement of the stop, the side wall includes two lugs and two supports, each of the two lugs has a hole, and the holes of the two lugs are located corresponding to each other, the two supports are located between the two lugs, each of the two supports has an arc concave located corresponding to the holes of the two lugs, each of the first and second portions has a first side, a second side and a connection wall which is connected between the first and second sides, each of the first and second sides has a hole, the two respective holes of the first and second sides are located symmetrically with each other, both of the second sides of the first and second portions are positioned between the two supports of the side wall, both of the first sides of the first and second portions are positioned between the two lugs of the side wall, the pivotal member pivotably connects the stop to the side wall via reception of the pivotal member in the holes of the two lugs, the arc concaves of the two supports, and the holes of the first and second sides; and a resilient member releasably captured between the stop and contact member to extend transversely across the pivotal member, the resilient member being biased to an extended configuration to position the stop at the first position, the resilient member being deflected intermediately about the pivotal member when the stop is in the second position to capture a post against the end wall.

7. The slide assembly as claimed in claim 6, wherein the contact member is defined at the face of the side wall, wherein a room is defined by the contact member and the face so that the resilient member is partially inserted into the room, the contact member having a contact portion, the resilient member having a bent portion which contacts the contact portion of the contact member.

8. The slide assembly as claimed in claim 6, wherein the resilient member has a bent portion and a fork portion, the bent portion contacting the side wall, the fork portion contacting the second free end portion of the stop.

9. A slide assembly for being installed to a rack which has at least two posts, each post having a plurality of holes, the slide assembly comprising:
a first rail having a first end and a second end which is located corresponding to the first end;
a second rail slidably connected to the first rail;
a third rail slidably connected to the second rail;
a first mounting bracket connected adjacent to the first end of the first rail and adapted to be installed to one of the posts of the rack;
a second mounting bracket connected adjacent to the second end of the first rail and adapted to be installed to the other one of the posts of the rack;
wherein at least one of the first mounting bracket and the second mounting bracket include:

a side wall extending in a longitudinal direction and having a face and a contact member formed thereon;
an end wall substantially perpendicular to the side wall;
at least one installation member connected to the end wall;
a stop extending in the longitudinal direction and pivotably connected to the side wall by a pivotal member and having a first portion, a second portion, and a middle portion connected to the first and second portions, the middle portion having a first free end portion and a second free end portion, the stop being pivotally displaceable between first and second positions, at least one of the first portion and the second portion having an extension section extending transversely therefrom to bear against the face of the side wall, the extension section remaining spaced from the end wall and limiting the pivotal displacement of the stop, the side wall includes two lugs and two supports, each of the two lugs has a hole, and the holes of the two lugs are located corresponding to each other, the two supports are located between the two lugs, each of the two supports has an arc concave located corresponding to the holes of the two lugs, each of the first and second portions has a first side, a second side and a connection wall which is connected between the first and second sides, each of the first and second sides has a hole, the two respective holes of the first and second sides are located symmetrically with each other, both of the second sides of the first and second portions are positioned between the two supports of the side wall, both of the first sides of the first and second portions are positioned between the two lugs of the side wall, the pivotal member pivotably connects the stop to the side wall via reception of the pivotal member in the holes of the two lugs, the arc concaves of the two supports, and the holes of the first and second sides; and a resilient member releasably captured between the stop and contact member to extend transversely across the pivotal member, the resilient member being biased to an extended configuration to position the stop at the first position, the resilient member being deflected intermediately about the pivotal member when the stop is in the second position to capture at least one of the posts against the end wall; and wherein the at least one installation member is adapted to be installed to one of the holes, and at least one of the posts is located between the at least one installation member and the stop.

10. The slide assembly as claimed in claim 1, wherein the first and second portions of the stop are located symmetrically with each other.

11. The slide assembly as claimed in claim 1, wherein the middle portion of the stop is configured to contact the post and to apply a force thereto.

* * * * *